US008924186B1

United States Patent
Zhao

(10) Patent No.: US 8,924,186 B1
(45) Date of Patent: Dec. 30, 2014

(54) SIMULATIONS OF PHYSICAL SYSTEMS FOR MULTIPLE EXCITATIONS

(75) Inventor: Kezhong Zhao, Wexford, PA (US)

(73) Assignee: SAS IP, Inc., Cheyenne, WY (US)

( * ) Notice: Subject to any disclaimer, the term of this patent is extended or adjusted under 35 U.S.C. 154(b) by 1019 days.

(21) Appl. No.: 12/878,552

(22) Filed: Sep. 9, 2010

(51) Int. Cl.
*G06F 17/50* (2006.01)

(52) U.S. Cl.
CPC ........ *G06F 17/5009* (2013.01); *G06F 17/5018* (2013.01)
USPC ................................................. 703/2; 703/13

(58) Field of Classification Search
None
See application file for complete search history.

(56) References Cited

U.S. PATENT DOCUMENTS

| | | | |
|---|---|---|---|
| 4,303,892 A | 12/1981 | Weller et al. | |
| 5,313,398 A | 5/1994 | Rohrer et al. | |
| 5,553,097 A | 9/1996 | Dagher | |
| 5,946,482 A | 8/1999 | Barford et al. | |
| 6,349,272 B1 | 2/2002 | Phillips | |
| 6,675,137 B1 | 1/2004 | Toprac et al. | |
| 6,785,625 B1 | 8/2004 | Fan et al. | |
| 6,832,170 B2 | 12/2004 | Martens | |
| 6,847,925 B2 * | 1/2005 | Ottusch et al. | 703/2 |
| 6,961,669 B2 | 11/2005 | Brunsman | |
| 7,034,548 B2 | 4/2006 | Anderson | |
| 7,127,363 B2 | 10/2006 | Loyer | |
| 7,149,666 B2 | 12/2006 | Tsang et al. | |
| 7,373,298 B2 * | 5/2008 | Ehara | 704/233 |
| 7,389,191 B2 | 6/2008 | Furuya et al. | |
| 7,539,961 B2 | 5/2009 | Dengi et al. | |
| 7,627,028 B1 | 12/2009 | Frei et al. | |
| 7,865,319 B1 | 1/2011 | Jacobs et al. | |
| 8,063,713 B2 | 11/2011 | Cheng et al. | |
| 8,245,165 B1 * | 8/2012 | Tiwary et al. | 716/108 |
| 8,386,216 B1 | 2/2013 | Al-Hawari et al. | |
| 2003/0158715 A1 * | 8/2003 | Ottusch et al. | 703/2 |
| 2003/0208327 A1 | 11/2003 | Martens | |
| 2005/0058208 A1 * | 3/2005 | Ehara | 375/241 |
| 2007/0038428 A1 | 2/2007 | Chen | |
| 2007/0073499 A1 | 3/2007 | Sawyer et al. | |
| 2007/0255538 A1 * | 11/2007 | Chu et al. | 703/2 |
| 2008/0120083 A1 | 5/2008 | Dengi et al. | |
| 2008/0120084 A1 | 5/2008 | Dengi et al. | |
| 2009/0184879 A1 | 7/2009 | Derneryd et al. | |
| 2009/0284431 A1 | 11/2009 | Meharry et al. | |
| 2009/0314051 A1 | 12/2009 | Khutko et al. | |
| 2010/0318833 A1 | 12/2010 | Reichel et al. | |
| 2011/0010410 A1 * | 1/2011 | DeLaquil et al. | 708/446 |
| 2011/0218789 A1 * | 9/2011 | Van Beurden | 703/13 |
| 2011/0286506 A1 | 11/2011 | Libby et al. | |
| 2012/0326737 A1 | 12/2012 | Wen | |

OTHER PUBLICATIONS

M. H. Gutknecht, "Block Krylov Space Methods for Linear Systems with Multiple Right-hand sides: An Introduction", pp. 1-22, 2006.*
Z. Badics, Z. J. Cendes, "A Newton-Raphson Algorithm With Adaptive Accuracy Control Based on a Block-Preconditioned Conjugate Gradient Technique", (Herein referred as Badics), pp. 1652-1655, 2005.*

(Continued)

*Primary Examiner* — Omar Fernandez Rivas
*Assistant Examiner* — Kibrom K Gebresilassie
(74) *Attorney, Agent, or Firm* — Goodwin Procter LLP

(57) ABSTRACT

Physical systems modeled by matrix equations may simultaneously be simulated for multiple excitations using, for example, an adaptive Krylov iterative recycling method.

17 Claims, 6 Drawing Sheets

(56) References Cited

OTHER PUBLICATIONS

M. H. Gutknecht, "Block Krylov Space Methods for Linear Systems with Multiple Righ-hand sides: An Introduction", pp. 1-22, 2006.*
Mayo et al., A Framework For The Solution of The Generalized Realization Problem, Linear algebra and its applications 425.2 (2007):634-662.
Al-Nashi, Phase unwrapping of digital signals, 1989, IEEE Transactions on Acoustics, Speech, and Signal Processing, 37(11):1693-1702.
Karam et al., Computation of the One-Dimensional Unwrapped Phase, 2007, Proceedings of the 2007 15th International Conference on Digital Signal Processing, pp. 304-307.
Tribolet, J., A new phase unwrapping algorithm, 1977, IEEE Transactions on Acoustics, Speech, and Signal Processing ASSP-25(2):170-177.
Tripathi et al., A SPICE model for multiple coupled microstrips and other transmission lines, 1985, IEEE Transactions on Microwave Theory and Techniques. MTT-33(12):1513-1518.
Antoulast A.C., On the Scalar Rational Interpolation Problem, IMA Jrl. of Mathematical Control and Information, 3:61-88 (1986).
Benner et al., Partial Realization of Descriptor Systems, and Control Letters, 55(11):929-938 (Jun. 13, 2006 preprint).
Blackburn, Fast Rational Interpolation, Reed-Solomon Decoding, and the Linear Complexity Profiles of Sequences. IEEE Transactions on Information Theory, 43(2):537-548 (Mar. 1997).
Bracken et al., S-Domain Methids for Simultaneous Time and Frequency Characterization of Electromagnetic Devices, IEEE Transactions on Microwave Theory And Techniques, 46(9):1277-1290 (1996).
Cai et al., Displacement Strucutre of Weighted Pseudoinverses, Applied Mathematics and Computation -153(2):317-335 (Jun. 4, 2004).
Chen, et al., Per-Unit-Length RLGC Extraction Using a Lumped Port De-Embedding Method for Application on Periodically Loaded Transmission Lines, 2006 Electronic Componets and Technology Conference, pp. 1770-1775.
Degerstrom et al, Accurate Resistance, Inductance, Capacitance, and Conductance (RLCG) From Uniform Transmission Line Measurements, Proceedings of the 18th Topical Meeting on Electrical Performance of Electronic Packaging, Oct. 2008, pp. 77-80.
Eisenstadt et al., S-Parameter-Based IC Interconnect Transmission Line Characterization. IEEE Transactions on Componets, Hybrids, and Manufacturing Technology, 15(4): 483-490 (Aug. 1992).
Fitzpatrick, On the Scalar Rational Interpolation Problems, Math Control Signals Systems, 9:352-369 (1996).
Gallivan et al, Model Reduction of MIMO Systems Via Tangential Interpolation, SIAM J. Matris Anal. Appl., 26(2):326-349 (2004).
Gallivan et al, Model reduction via tangential interpolation, MTNS2002 (15th Symp, on the Mathematical Theory of Networks and Systems) (2002) 6 pages.
Gallivan et al, Model Reduction via Transaction: An Interpolation Point of View, Linear Algebra and its Applications, 375:115-134 (2003).
Gruodis, et al, Coupled Lossy Transmission Line Characterization and Simulation, IBM J. Res. Develop., 25(1): 25-41 (Jan. 1981).
Han et al, Frequency-Dependent RLGC Extraction for a Pair of Coupled Transmission Lines Using Measured Four-Port S-Parameters, 63rd ARTFG Conference Digest, Jun. 2004, pp. 211-219.
Hill et al, Crosstalk Between Microstrip Transmission Lines, IEEE Transactions on Electromagnetic Compatibility, 36(4):314-321 (Nov. 1994).
Hiptmair, Symmetric Coupling for Eddy Current Problems, SIAM J. Numer Anal. 40(1) 41-65 (2002).
Karam, Computation of the One-Dimensional Unwrapped Phase, Massachusetts Insitute of Technology Thesis, Jan. 2006, 101 pages.
Kim et al, Implementation of Broadbend Transmission Line Models with Accurate Low Frequency response for High-Speed System Simulations, DesignCon 2006, 25 pages.

Kiziloglu et al, Experimental Analysis of Transmission Line Parameters in High-Speed GaAs Digital Circuit Interconnects, IEEE Transactions on Microwave Theory and Techniques, 39(*8):1361-1367 (Aug. 1991).
Knockaert et al. Recovering Lossy Multiconductor Transmission Line Parameters From Impedance or Scattering Representations, Proceedings of the 10th Topical Meeting on Electrical Performance of Electronic Packaging, Cambridge, MA, Oct. 2001, pp. 35-38.
Knockaert et al, Recovering Lossy Multiconductor Transmission Line Parameters From Ipedance or Scattering Representation, IEEE Transactions on Advanced Packaging, 25(2):200-205 (May 2002).
Laigudi et al. Accurate Transient Simulation of Interconnects Charcterization by Band-Limited Data With Propagation Delay Enforcement in a Modified Nodal Analysis Framework, IEEE Transactions on Electromagnetic Compatibility, 50(3):715-729 (Aug. 2008).
Lee et al, A Non-Overlapping Domain Decomposition Method with Non-Matching Grids for Modeling Large Finite Antenna Arrays, J. Comput. Phys., 203:1-21 (Feb. 2005).
Lefteriu et al, Modeling Multi-Port Systems from Frequency response Data via Tangential Interpolation, *IEEE,* 4 pages (2009).
Leung et al, Characterization and Attenuation Mechanism of CMOS-Compatiable Micromachined Edge-Suspended Copianer Waveguides on Low-Resistivity Silicon Substrate, IEEE Transaction on Advanced Pakaging, 29(3):496-503 (Aug. 2006).
Li et al, Model Order Reduction of Linear Networks with Massive Ports via Frequency-Dependent Port Packaging, 2006 43rd ACM/IEEE Design Automation Conference, pp. 267-272 (2006).
Narita et al, An Accurate Experimental Method for Characterizing Transmission Lines Embedded in Multilayer Printed Circuit Boards, IEEE Transactions on Advanced Packaging, 29(1):114-121 (Feb. 2006).
Oh et al, Improved Method for Characterizing Transmission Lines Using Frequency-Domain Measurements, Proceedings of the 13th Topical Meeting on Electrical Performance of Electronic Packaging, pp. 127-130 (Jul. 2004).
Sampath, On Adressing the Practical Issues in the Extraction of RLGC Parameters for Lossy Multiconductor Transmission Lines Using S-Parameter Models, Proceedings of the 18th Topical Meeting on the Electrical Performance of Electronic Pacakaging, pp. 259-262 (Oct. 2008).
Schrama, Approximate Identification and Control Design with Application to a Mechanical System, Delft University of Technology, Thesis, 294 pages (1992).
Vandendorpe, Model Reduction of Linear Systems, and Interpolation Points of View, Univ. Catholique de Louvain, Center for Systems Engineering and Applied Mechanics, 162 pages (Dec. 1, 2004).
Woracek, Multiple Point Interpolation in Nevanlinna Classses, Integral Equations and Operator Theory, 28(1):97-109, (Mar. 1997).
Antoulas, A new result on passivity preserving model reduction, Systems & amp: Control Letters, 54(4): 361-374, Apr. 2005.
Astolfi, A new look at model reduction by moment matching for linear systems, Decision and Control, 2007 46th IEEE Conference, pp. 4361-4366, Dec. 12-14, 2007.
Hebermehl et al, Improved numerical methods for the simulation of microwave circuits, 1997, Weierstrass Institute for Applied Analysis and Stochastics, pp. 1-14.
Peng et al, Non-conformal domain decomposition method with second-order transmission conditions for timeharmonic electromagnetics, Journal of Computational Physics 229, Apr. 10, 2010, pp. 5615-5629.
Zhao et al, A Domain Decomposition Method With Nonconformal Meshes for Finite Periodic and Semi-Periodic Structures IEEE Transactions on Antennas and Propagation, vol. 55, No. 9, Sep. 2007.
Wolfe et al, A Parallel Finite-Element Tearing and Interconnecting Algorithm for Solution of the Vector Wave Equation with PML Absorbing Medium IEEE Transaction on Antennas and Propagation, vol. 48, No. 2, Feb. 2000.

\* cited by examiner

SIMULATIONS OF PHYSICAL SYSTEMS FOR MULTIPLE EXCITATIONS

FIELD OF THE INVENTION

The present invention relates, generally, to systems and methods for simulating physical systems, and, in particular, to simulating physical systems simultaneously for multiple excitations.

BACKGROUND

The behavior of physical systems in response to excitations can often be modeled with a linear system of equations. For example, electronic or electrical circuits or networks may be modeled by Kirchhoff's laws, which relate the currents through and voltages across the network components (such as, e.g., resistors, capacitors, transmission lines, voltage sources, etc.). Excitations of the systems may be characterized in terms of input currents and/or voltages provided by current/voltage sources and/or fixed at terminals of the network. Similarly, other physical networks, such as, e.g., pneumatic or hydraulic networks, may be modeled reasonably well by appropriate linear equations for the associated physical quantities. The linear system of equations, typically expressed as a system matrix equation, may be used to simulate the way the physical quantities associated with the system behave or evolve over time.

Physical fields, i.e., physical quantities defined at each point within a user-defined domain (e.g., a surface or volume specified geometrically, and generally corresponding to a two-, or three-dimensional region of a physical object), can likewise often be simulated using a system matrix equation. For that purpose, the fields are modeled by field-governing equations and applicable boundary conditions, which, together, describe the behavior of the field within and at the boundaries of the domain. For example, Maxwell's equations describe the behavior of an electromagnetic field, and the heat equation describes the behavior of a temperature field. The field values at the domain boundaries, as well as any source (or sink) terms in the equations, constitute the "excitations" of the system. To facilitate computational solution of the problem, the field-governing equations and boundary conditions are then discretized, resulting in a (typically large) linear system of equations. Discretization facilitates finding approximate solutions of differential or integral equations (such as, e.g., Maxwell's equations), i.e., it enables problems lacking exact mathematical ("analytical") solutions to be approximated computationally ("numerically"). A numerical technique such as, for example, a finite difference, finite volume, and/or finite element method may be used to accomplish the discretization.

To numerically simulate the physical system (e.g., the network or field), the system matrix equation may be solved with a direct or iterative solver, depending on the size and characteristics of the linear system. (A "solver," as the term is used herein, denotes a method for solving a system of equations, or a computer program implementing such a method, as determined by context.) Whereas a direct solver typically factorizes the system matrix into a product of special matrices (such as, e.g., the upper and lower triangular portions of the system matrix) and, thereafter, solves the equations by forward and/or backward substitution, an iterative solver solves the equations simultaneously in steps, with each step refining a previous approximation to more closely approach the exact solution. For large problems (e.g., three-dimensional electromagnetic problems defined over a large domain), direct solvers potentially require prohibitive amounts of memory and suffer poor parallel scalability. Therefore, iterative solvers typically present the only practical means for solving large systems. The iterative process is typically interrupted when a "residual vector" that quantifies the deviation of the approximation from the exact solution falls below a user-defined error, indicating the acceptability of the approximation—i.e., convergence of the solution. In order to increase the convergence rate of the system so that fewer iterations are needed to reach the acceptable approximation, the matrix may be "preconditioned" by applying a "preconditioner" matrix to the system matrix.

Many problems can be solved efficiently using a sub-class of iterative solvers usually referred to as "Krylov subspace iterative solvers." In Krylov subspace methods, the solution is sought in a vector subspace whose dimensionality grows by one with each iteration. Conceptually, as the dimensionality of the subspace is gradually increased, the error components of the approximation correspondingly decrease. The Krylov subspace is spanned by Krylov vectors, which may be chosen to be, or based on, the residual vectors associated with each iteration. Since the residual vectors depend on the excitation, problems with multiple excitations are conventionally solved by constructing the Krylov subspace, and computing the solution vector therein, for each excitation independently. This generic approach is, however, often computationally more expensive than necessary. For example, certain types of problems, such as, e.g., monostatic scattering problems or other implicit time domain methods (where an iterative solver is used in each time step), have linearly dependent excitations—a property that conventional methods fail to exploit. Even if the excitations are linearly independent, their corresponding Krylov subspaces sometimes overlap. It is desirable to utilize this overlap to decrease the total number of iterations required to solve linear problems with multiple excitations.

SUMMARY

The present invention provides systems and methods for simulating physical systems simultaneously for multiple excitations. Physical systems in accordance with the invention can generally be modeled by a linear system of equations (and, thus, by a matrix equation), and include, for example, physical networks (e.g., electronic circuits), as well as vector fields (e.g., electromagnetic, acoustic, or mechanical force fields) and/or scalar fields (e.g., temperature or pressure fields) defined over a user-defined domain (i.e., a one, two-, or three-dimensional region of a physical object in which the respective physical field(s) are of interest). Simulations of physical fields in user-defined domains may be used for a variety of practical applications. Exemplary applications include (but are not limited to) determining the radar cross-section of an airplane based on electromagnetic fields at the surface of the airplane; simulating forces and torques produced in an electromechanical system; optimizing optical or electrical structures for signal transmission based on the electromagnetic fields inside the structures; assessing the structural integrity of a building, machine, or vehicle based on mechanical, thermal, and/or electric fields at the surface or in the interior of these structures; optimizing a product design based on a prediction of the real-world behavior of the product in response to electrical, thermal, and/or mechanical stimuli; and studying the effect of electromagnetic waves on the temperature distribution in the human brain. The physical fields may (but need not) be represented graphically, or in another intuitive way, to provide insight into the interaction of the field with the physical object and/or its effect on other physical properties (e.g., mechanical stresses or temperature distributions).

An "excitation," as the term is used herein, refers to the right-hand-side of the matrix equation (or linear system of equations) modeling the physical system, and typically corresponds to physical quantities fixed for certain components or at certain locations of the physical system. For example, excitations may specify boundary values of physical fields, or input values of physical quantities in a network. The physical system can be simulated for each individual excitation by iteratively approximating a solution vector of the matrix equation for that excitation. Simulating the physical system for multiple excitations "simultaneously" denotes that, in between successive updates of the approximated solution vector associated with one excitation, approximated solution vectors associated with other excitations are likewise updated. For example, in some embodiments, each iteration involves updating the approximations of the solutions for all excitations.

In various embodiments, the simulation is accomplished using a modified Krylov subspace iterative method, in which the solution vectors for all excitations are expressed in a single, shared Krylov subspace. In each iteration of the modified Krylov method, the residual vectors associated with the approximated solutions for all the excitations are compared, and a new Krylov vector is generated based on the largest residual. The approximated solutions for all excitations are then updated based on the new Krylov vector (using, for example, a generalized conjugate residual iteration, as known to those of skill in the art). Building up a shared Krylov subspace (i.e., "recycling" Krylov vectors among multiple excitations) may create synergies resulting from overlap in the Krylov subspaces associated with individual excitations. Further, adapting the method in each iteration to the momentarily most "difficult" excitation by tackling the largest among the residual errors, the total number of iterations that are needed to solve the problem for multiple excitations may be kept low.

In a first aspect, the invention provides a computer-implemented method for electronically simulating a physical system simultaneously for a plurality of excitations. The physical system may be or include, for example, a physical field (such as, e.g., an electromagnetic field) in a user-defined domain, or a physical network (such as, e.g., an electronic or electrical circuit, a pneumatic circuit, and/or a hydraulic circuit). The method includes storing a model of the physical system based on a system matrix in computer memory. The physical system is then computationally simulated by initiating approximations of physical quantities associated with the physical system (e.g., components of the physical field at a plurality of locations within the user-defined domain, or quantities associated with components of the physical network) for the plurality of excitations and storing them in computer memory, and iteratively improving the approximations based (at least in part) on the model. The iterative improvements involve selecting an excitation from the plurality of excitations based on residual errors associated with the approximations, and updating the approximations and the associated residual errors associated for all of the excitations based (at least in part) on the selected excitation. The residual errors may be based on, or equal, a difference between the excitations and the approximations multiplied by the system matrix.

In some embodiments, the approximations of the physical quantities are initiated by setting them to zero. Updating the excitations may involve computing a Krylov vector for each iteration based (at least in part) on the selected excitation (which may be the excitation associated with the maximum residual error resulting from the previous iteration), and updating the approximations and associated residual errors for all of the plurality of excitations based (at least in part) on the Krylov vector for the respective iteration. The updating step may further include enforcing that the Krylov vectors are linearly independent, e.g., by conjugating the Krylov vectors by modified Gram-Schmidt conjugation. In certain embodiments, the excitations may be updated by performing a generalized conjugate residual iteration. The iterative improvements may be aborted when the residual errors fall below a user-defined threshold.

In another aspect, the invention is directed to a computer system for simulating a physical system (such as, e.g., a physical field in a user-defined domain) simultaneously for a plurality of excitations. The computer system includes a memory for storing parameters representative of the physical system, and an analysis module for modeling the physical system with a system matrix, and simulating the physical system in the way describe above.

According to yet another aspect, the invention provides a computer-implemented method of simulating a physical field in a user-defined domain simultaneously for a plurality of excitations by storing a model of the physical field in the domain that is based on a system matrix in computer memory, and computationally simulating the physical field by iteratively approximating the physical field for the plurality of excitations in a shared Krylov subspace. The Krylov subspace is updated in each iteration based on a largest residual error associated with the approximations for the plurality of excitations.

BRIEF DESCRIPTION OF THE DRAWINGS

The foregoing will be more readily understood from the following detailed description in conjunction with the drawings, in which.

DETAILED DESCRIPTION

Figure 1:
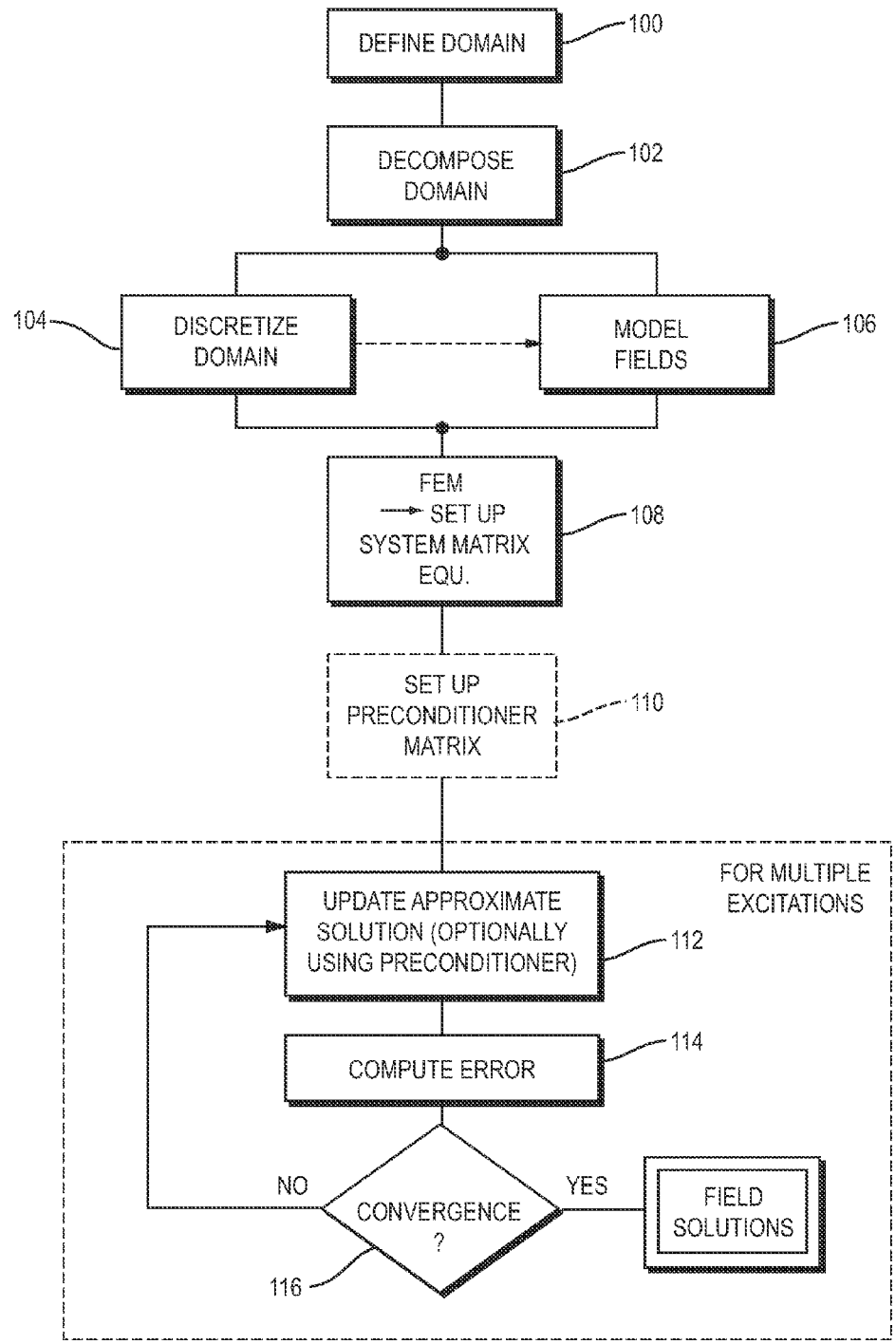
FIG. 1 is a flow chart illustrating a method for simulating physical fields in accordance with various embodiments.

Various embodiments of the present invention relate to the simulation of electromagnetic fields in user-defined domains and, more particularly, to domain-decomposition-based finite element methods. FIG. 1 provides an overview over the simulation process in form of a flow chart. The method begins with the definition of the domain of interest (step 100) by the user, and the decomposition of that domain into multiple subdomains (step 102). In preferred embodiments, the decomposition into subdomains is accomplished automatically, without human intervention, using, e.g., a software module. The subdomains are then discretized into many elements (step 104), which, collectively, cover the subdomains. A two-dimensional domain or subdomain (i.e., a surface), for example, may be "meshed" into polygonal (e.g., triangular or quadrilateral) elements. However, discretizations that result in elements with curved edges are also possible. A three-dimensional (sub-)domain may, for example, be divided into tetrahedral elements; again, elements with curved faces may be used as well. The subdomains may or may not overlap. If two subdomains overlap, their discretizations need to conform (i.e., be the same) in the overlap region. This requirement generally poses constraints on the type and scale of discretization used. Since non-overlapping domain decomposition are not subject to such constraints, they, advantageously, facilitate independent meshing of the various subdomains. Preferred embodiments, therefore, utilize non-overlapping domain decomposition. It should be understood, however, that the techniques and improvements to which various aspects of the instant invention are directed are generally applicable to both overlapping and non-overlapping DDMs, and that the scope of the invention is, accordingly, not limited to non-overlapping DDMs.

In step 106, the electric and magnetic fields in the user-defined domain, and associated electric currents, are modeled by formulating Maxwell's equations for each subdomain, and providing boundary conditions (also referred to as transmission conditions) at the interfaces between subdomains. Together, the bulk equations (i.e., the equations applicable to the interior of the domain) and the boundary equations define a boundary value problem. Transmission conditions are designed to "undo" the effect of the artificial (i.e., non-physical) division of the domain into multiple subdomains, and to ensure the mutual consistency of the field solutions for the various subdomains. In particular, transmission conditions are intended to guarantee the continuity of the fields across the subdomain boundaries, which, in practice, is usually accomplished only in approximation. The choice of transmission conditions significantly affects both the accuracy of the simulation and the computational cost associated with it. Choosing transmission conditions involves selecting a particular type of conditions, as well as specifying values for parameters of the conditions. In certain embodiments, second-order Robin-type transmission conditions are used, and the Robin coefficients contained therein are set so as to improve or optimize the convergence properties of the simulation, as further described below.

In step 108, the field-modeling equations are discretized over the discretized domain, using a finite element method as known to persons of skill in the art. This involves rephrasing the boundary value problem in its variational form, and expanding the fields in terms of piecewise polynomial basis functions, each of which is non-zero in, typically, only a small number of contiguous elements of the domain. (The term "fields" denotes, in this context, the entirety of physical-field quantities to be obtained directly (as opposed to indirectly via post-processing of simulated fields) by the simulation, i.e., the electric and/or magnetic fields as well as the currents.) The result is a matrix equation of the form $A\bar{x}=\bar{b}$, in which the solution vector $\bar{x}$ specifies the values of the field components (in terms of the amplitudes of the basis functions), and the system matrix A and excitation vector $\bar{b}$ together characterize the physical properties of the domain in conjunction with the field-governing equations. The excitation vector $\bar{b}$ contains information about the sources and sinks of the fields (e.g., electrical charges) as well as about constraints imposed on the boundaries (e.g., a particular electric potential at the surface). The dimensionality of the system matrix and the solution and excitation vectors is the number of basis functions, or finite elements. The system matrix A generally has block form. For example, for the case of two subdomains, it takes the form:

$$A = \begin{bmatrix} K_1 & -G_{12} \\ -G_{21} & K_2 \end{bmatrix},$$

where the diagonal blocks $K_i$ correspond to the individual subdomains $\Omega_i$, and off-diagonal blocks $-G_{ij}$ correspond to couplings between the subdomains. In certain embodiments, the diagonal blocks (or submatrices) themselves are block lower triangular matrices, whose diagonal sub-blocks are symmetric if there are no non-reciprocal material properties involved.

The matrix equation resulting from discretization of the boundary value problem is solved iteratively for one or more excitations (characterized by corresponding excitation vectors $\bar{b}$). Often, this iterative process involves preconditioning the system matrix, typically via one or more matrix operations, to achieve improved numerical properties, such as, e.g., a better condition number. In a general sense, DDM can be conceived as block generalization of classical preconditioners, such as Jacobi and Gauss-Seidel preconditioners. Since the convergence of such classical preconditioners relies heavily on the spectral radius of the "iteration" matrix, i.e., the preconditioned system matrix, the role of a "successful" transmission condition is thus to minimize the spectral radius. In some embodiments, an additional preconditioner that advantageously combines Gauss-Seidel-type and Jacobi-type preconditioning (as explained in more detail below) is set up in step 110, and subsequently used during the iterative solution.

The iterative solution of the (optionally preconditioned) system matrix equation involves approximating the solution vector $\bar{x}$ (the initial approximation typically being a guess) (step 112), applying the system matrix to determine an error associated with the approximation (step 114), evaluating the error against a threshold or applying a similar convergence criterion (step 116), and refining the approximation of $\bar{x}$ if (and only if) the convergence criterion is not satisfied. For example, consider a system matrix equation based on domain-decomposition, which may be written as:

$$\begin{bmatrix} K_1 & -G_{12} \\ -G_{21} & K_2 \end{bmatrix} \begin{bmatrix} \bar{u}_1 \\ \bar{u}_2 \end{bmatrix} = \begin{bmatrix} \bar{y}_1 \\ \bar{y}_2 \end{bmatrix} \text{ with } \bar{x} = \begin{bmatrix} \bar{u}_1 \\ \bar{u}_2 \end{bmatrix} \text{ and } \bar{b} = \begin{bmatrix} \bar{y}_1 \\ \bar{y}_2 \end{bmatrix},$$

where $\bar{u}_i$ and $\bar{y}_i$ are the solution vectors and excitations of the subdomains, respectively. This equation may be solved using Jacobi iterations:

$$\begin{bmatrix} K_1 & 0 \\ 0 & K_2 \end{bmatrix} \begin{bmatrix} \bar{u}_1 \\ \bar{u}_2 \end{bmatrix}^{(n)} = \begin{bmatrix} \bar{y}_1 \\ \bar{y}_2 \end{bmatrix} + \begin{bmatrix} 0 & G_{12} \\ G_{21} & 0 \end{bmatrix} \begin{bmatrix} \bar{u}_1 \\ \bar{u}_2 \end{bmatrix}^{(n-1)}$$

$$\begin{bmatrix} \bar{u}_1 \\ \bar{u}_2 \end{bmatrix}^{(n)} = \begin{bmatrix} K_1 & 0 \\ 0 & K_2 \end{bmatrix}^{-1} \begin{bmatrix} \bar{y}_1 \\ \bar{y}_2 \end{bmatrix} + \begin{bmatrix} K_1 & 0 \\ 0 & K_2 \end{bmatrix}^{-1} \begin{bmatrix} 0 & G_{12} \\ G_{21} & 0 \end{bmatrix} \begin{bmatrix} \bar{u}_1 \\ \bar{u}_2 \end{bmatrix}^{(n-1)},$$

where n denotes the iteration number of the iterative solution process. To initialize the approximate solution (step 112), $\bar{u}_1^{(-1)}$ and $\bar{u}_2^{(-1)}$ may be set to zero, resulting in $\bar{u}_1^{(0)} = K_1^{-1}\bar{y}_1$ and $\bar{u}_2^{(0)} = K_2^{-1}\bar{y}_2$. This initial solution may then be updated iteratively according to:

$$\bar{u}_1^{(n)} = \bar{u}_1^{(0)} + K_1^{-1}G_{12}\bar{u}_2^{(n-1)}$$

$$\bar{u}_2^{(n)} = \bar{u}_2^{(0)} + K_2^{-1}G_{21}\bar{u}_1^{(n-1)}.$$

This requires calculating, for each iteration, the error (or "correction vector")

$$\bar{r}_i^{(n)} = K_i^{-1}G_{ij}\bar{u}_j^{(n-1)}$$

(step 114), which may, in turn, be accomplished by a direct or an iterative solver. Steps 112, 114, 116 are typically repeated many times before the solution vector has converged according to the convergence criterion.

In some embodiments, a Krylov subspace method (explained below) is used to iteratively solve the matrix equation. If the equation needs to be solved for multiple excitation vectors $\bar{b}$, the iteration process may be carried out for each excitation separately. This may be accomplished in parallel, using as many processors as there are excitations. However, this approach would preclude parallelizing the solution of each individual matrix equation, as is done in DDMs. In an alternative approach, which is consistent with DDM, solution vectors for some or all excitations may be computed together (or "simultaneously") by interposing, between sequential iterations for one excitation, iterations for other excitations. In certain embodiments, the simultaneous solution of the matrix equation for multiple excitations is accomplished with a modified Krylov method, explained in detail below, that exploits synergies to achieve convergence of the solution vectors for multiple excitations in fewer iterations than would be required to solve the equations individually for the different excitations.

Various aspects of the invention are directed to different steps of the method outlined above. These aspects may be employed individually and independently of one another, or in combination, and each of them may contribute to a performance improvement of electromagnetic simulations as described herein. In certain embodiments, several inventive features are utilized together, and result in an aggregate performance enhancement. However, the scope of certain aspects of the invention is generally not limited to the method illustrated in FIG. 1, or to electromagnetic simulations. For example, matrix preconditioning may generally be utilized in simulations of any system amenable to description in the form of a matrix equation, and simultaneous solutions of matrix equations for multiple right-hand sides $\bar{b}$ may be employed in many problems where the response of a system to multiple excitations is of interest. The following sections describe various aspects and embodiments of the invention in more detail.

1. Domain-Decomposition Formulation of Electromagnetic Boundary Value Problems

Figure 2:
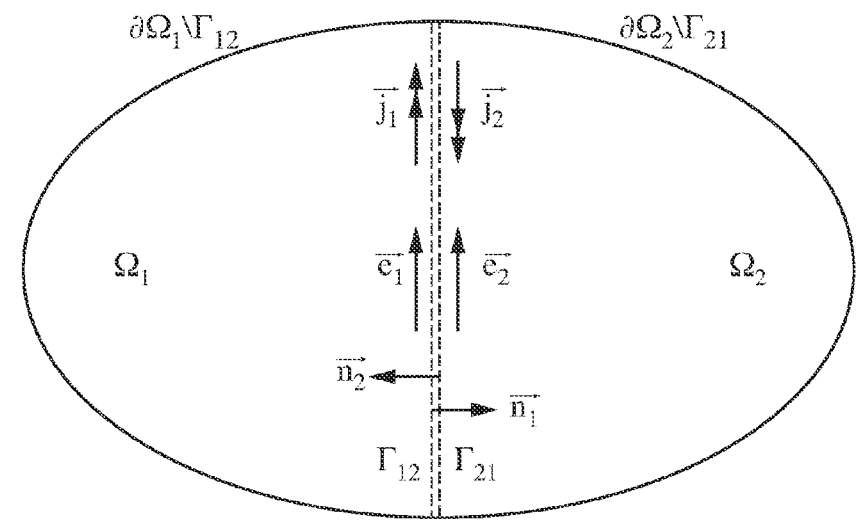
FIG. 2 is a diagram illustrating decomposition of a domain into two subdomains in accordance with one embodiment.

For illustration purposes, domain-decomposition methods in accordance with various embodiments are, in the following, described with reference to an exemplary decomposition of a domain into two non-overlapping subdomains, as shown in FIG. 2. Persons of ordinary skill in the art will be able to readily generalize the described methods to an arbitrary number of subdomains, as well as to overlapping subdomains if desired. In FIG. 2, an exemplary domain $\Omega$ is decomposed into two non-overlapping subdomains $\Omega_1$ and $\Omega_2$ by an interface $\Gamma_{12} = \Gamma_{21}$. Herein, an artificial distinction is made between the coincident interfaces $\Gamma_{12}$ and $\Gamma_{21}$, which are illustrated as two dashed lines, to allow for different meshing at either side of the interface. The boundary of $\Omega_i$ (with i=1 or 2) is denoted by $\partial\Omega_i$, and includes the common interface $\Gamma_{ij}$ (with i≠j) and a portion of the external boundary of $\Omega_i$, denoted by $\partial\Omega_i \backslash \Gamma_{ij}$. In general, the domain may be partitioned into N domains:

$$\Omega = \bigcup_{i=1,N} \Omega_i, \; \Omega_i \cap \Omega_j = \emptyset, \; 1 \le i \ne j \le N.$$

The boundary value problem for the two domains may be formulated using time-harmonic Maxwell's equations for the interior of the subdomains:

$$\nabla \times \frac{1}{\mu_{r1}} \nabla \times \vec{E}_1 - k_0^2 \varepsilon_{r1} \vec{E}_1 = -jk_0\eta \vec{J}_1^{imp} \quad \text{in } \Omega_1$$

$$\nabla \times \frac{1}{\mu_{r2}} \nabla \times \vec{E}_2 - k_0^2 \varepsilon_{r2} \vec{E}_2 = -jk_0\eta \vec{J}_2^{imp} \quad \text{in } \Omega_2;$$

first-order absorbing boundary conditions at the exterior surfaces (also called the "truncation boundaries"):

$$\vec{j}_1 + jk_1\vec{e}_1 = 0 \quad \text{on } \partial\Omega_1 \backslash \Gamma_{12}$$

$$\vec{j}_2 + jk_2\vec{e}_2 = 0 \quad \text{on } \partial\Omega_2 \backslash \Gamma_{21};$$

and second-order Robin-type transmission conditions at the interface between the subdomains:

$$\vec{j}_1 + A_1\vec{e}_1 + B_1\overrightarrow{\text{curl}}_\Gamma \text{curl}_\Gamma \vec{e}_1 = -\vec{j}_2 + A_1\vec{e}_2 + B_1\overrightarrow{\text{curl}}_\Gamma \text{curl}_\Gamma$$
$$\vec{e}_2 \text{ on } \Gamma_{12} \text{ and}$$

$$\vec{j}_2 + A_2\vec{e}_2 + B_2\overrightarrow{\text{curl}}_\Gamma \text{curl}_\Gamma \vec{e}_2 = -\vec{j}_1 + A_2\vec{e}_1 + B_2\overrightarrow{\text{curl}}_\Gamma \text{curl}_\Gamma$$
$$\vec{e}_1 \text{ on } \Gamma_{21},$$

where $k_0$, $\eta$, $\varepsilon_{ri}$, and $\mu_{ri}$ are the free-space wave number, impedance, relative permittivity, and relative permeability of the medium in $\Omega_i$, respectively. Further, $\vec{E}_i$ (i=1, 2) denotes the electric field interior to $\Omega_i$, $\vec{J}_i^{imp}$ are impressed electric currents representing near-field excitations, and $\vec{e}_i$ and $\vec{j}_i$ are tangential electric fields and surface electric currents, respectively, which may be expressed in terms of the electric field and the outward normals $\vec{n}_i$ of $\Omega_i$ according to:

$$\vec{e}_i = \vec{n}_i \times \vec{E}_i \times \vec{n}_i, \; \vec{j}_i = \frac{1}{\mu_{ri}} \nabla \times \vec{E}_i \times \vec{n}_i,.$$

The surface scalar curl, $\text{curl}_\Gamma \vec{A}$, and the surface vector curl, $\overrightarrow{\text{curl}}_\Gamma q$, are defined as:

$$\text{curl}_\Gamma \vec{A} = \frac{\partial A_x}{\partial x} - \frac{\partial A_y}{\partial y}, \; \overrightarrow{\text{curl}}_\Gamma q = \vec{x}\frac{\partial q}{\partial y} - \vec{y}\frac{\partial q}{\partial x}.$$

The first-order absorbing boundary conditions at the truncation boundary are chosen for simplicity. The formulation described herein can, however, be readily generalized to other truncation conditions known to those of ordinary skill in the art. For example, higher order absorbing boundary conditions, perfectly matched layer conditions and exact integral equation conditions may be used.

Finally, the $A_i$ and $B_i$ are the Robin coefficients, corresponding to first-order and second-order terms, respectively, for the two subdomains. (For first-order conditions, these coefficients would reduce to $A_i=jk_i$ and $B_i=0$.) Second-order conditions, in general, may contain different or additional second-order terms (i.e., terms that include second-order derivatives). In some embodiments, third-order or higher-order Robin-type transmission conditions are employed. Moreover, mixed-order conditions may be used, e.g., transmission conditions of different orders may be used for different subdomain interfaces.

The choice of transmission conditions may have a significant effect on the convergence properties and, thus, on the parallelizability and numerical scalability of the electromagnetic problem. For example, during the iterative solution of a problem formulated with first-order Robin-type transmission conditions, only approximation errors associated with propagating electromagnetic waves are damped, while errors associated with evanescent waves are not. As a result, the solution does not always converge with first-order Robin-type conditions if there are significant evanescent errors. When second- or higher-order Robin-type conditions are used, however, both propagating-wave and evanescent-wave errors are damped, provided that Robin coefficients are chosen appropriately.

Various embodiments of the present invention provide a systematic way of determining appropriate Robin coefficients, i.e., Robin coefficients that result in optimal or nearly optimal convergence for a given problem formulation involving second-order Robin transmission conditions. In this approach, the Robin coefficients are selected dependent on the material properties associated with the subdomain interfaces and the frequency (and, thus, free-space wave number) of the excitations. In certain embodiments, the Robin coefficients are, more specifically, expressed as:

$$A_i = \alpha_i k_0 \sqrt{\frac{\varepsilon_{ri}}{\mu_{ri}}} \text{ and } B_i = \frac{\beta_i}{k_0 \mu_{ri} \sqrt{\mu_{ri} \varepsilon_{ri}}},$$

where $\alpha_i$ and $\beta_i$ are constants for each interface between subdomains.

The Robin coefficients may further depend (e.g., via the constants $\alpha_i$ and $\beta_i$) on parameters of the discretization of the problem, such as the mesh sizes of the discretized subdomain and the basis order of the finite elements in terms of which the fields are expanded. In certain embodiments, the constants $\alpha_i$ and $\beta_i$ are related by:

$$\text{Re}(\alpha_i) = \text{Im}(\beta_i) = -C\frac{k_{ave}}{2p}, \text{Im}(\alpha_i) = \text{Re}(\beta_i) = \frac{k_{ave}}{2p},$$

where $k_{ave}$ is an average wave number corresponding to the interface (i.e., a wave number averaged over the meshes of the discretized interface, which may have different material properties and, consequently, different wave numbers associated with them). Further, C is a constant dependent on the basis order of the finite elements, and p is a mesh-dependent constant that may be given by:

$$p = \frac{\sqrt{k_{max}} C_\omega^{1/4}}{\sqrt{2}} \text{ with } k_{max} = s\frac{\pi}{h_{min}} \text{ and } C_\omega = \min(k_+^2 - k_{ave}^2, k_{ave}^2 - k_-^2),$$

where s is another basis-order-dependent constant, and $h_{min}$ is the smallest edge length of the mesh of the interface (and, accordingly, $k_{max}$ is the largest wave number supported by the interface mesh). The constants $k_+$ and $k_-$ relate to the two smallest side lengths a and b of the bounding box of $\Omega_i$ (which is a cuboid whose faces are each tangential to the surface of $\Omega_i$) according to:

$$k_- = \pi\sqrt{\frac{m_1^2}{a^2} + \frac{n_1^2}{b^2}} \text{ and } k_+ = \pi\sqrt{\frac{m_2^2}{a^2} + \frac{n_2^2}{b^2}},$$

where, $m_1$, $n_1$, $m_2$, and $n_2$ are the smallest positive integers for which the following inequality holds:

$$\pi\sqrt{\frac{m_1^2}{a^2} + \frac{n_1^2}{b^2}} \leq k_{ave} \leq \pi\sqrt{\frac{m_2^2}{a^2} + \frac{n_2^2}{b^2}}.$$

As indicated, the constants C and s depend on the basis order of the finite elements. In preferred embodiments, if first-order and/or second-order basis functions are used, $C=0.5$ and $s=0.5$. If third-order basis functions are used, the constants are preferably chosen as $C=0.25$ and $s=1.0$.

Based on the mathematical model of the electromagnetic fields in the discretized user-defined domain (as described in the preceding paragraphs), a system matrix may be generated, and a corresponding system matrix equation may be derived using FEM. In one approach, the electric fields $\vec{E}_1$ and surface electric currents $\vec{j}_1$ are sought in curl-conforming subspaces of Hilbert spaces (as defined, for example, in Hiptmair, R. "Symmetric Coupling for Eddy Current Problems," SIAM J. Numer. Anal., vol. 40, no. 1, pp. 41-65 (2002), which is hereby incorporated herein by reference in its entirety), $$\vec{E}_1 \in H(\text{curl};\Omega_1) \text{ and } \vec{j}_1 \in H_\perp^{-1/2}(\text{curl}_\Gamma;\Gamma_{12}),$$

such that:

$$b(\vec{v}_1, \vec{E}_1) - \langle \gamma_t \vec{v}_1, \vec{j}_1 \rangle_{\Gamma_{12}} = jk_0\eta(\vec{v}_1, \vec{J}_1^{imp})_{\Omega_1} \text{ for all}$$
$$\vec{v}_1 \in H(\text{curl};\Omega_1) \quad (1),$$

where the tangential surface trace $\gamma_t$ is defined, for any vector by $\gamma_t \vec{u} = \vec{n} \times \vec{u} \times \vec{n}$, and the bilinear forms $b(\bullet, \bullet)_\Omega$, $\langle \bullet, \bullet \rangle_\Gamma$, and $(\bullet, \bullet)_\Omega$ are defined by:

$$b(\vec{v}, \vec{u})_\Omega = \int_\Omega \left[(\nabla \times \vec{v}) \cdot \frac{1}{\mu_r}(\nabla \times \vec{u})\right] dx^3 - k_0^2 \int_\Omega (\vec{v} \cdot \varepsilon_r \vec{u}) dx^3,$$

$$(\vec{v}, \vec{u})_\Omega = \int_\Omega (\vec{v} \cdot \vec{u}) dx^3, \text{ and}$$

$$\langle \vec{v}, \vec{u} \rangle_\Gamma = \int_\Gamma (\vec{v}, \vec{u}) dx^2.$$

Appropriate testing functions for second-order Robin conditions are $\gamma_t \vec{v}_1 \in H_\perp^{-1/2}(\text{curl}_\Gamma, \Gamma_{12})$. Using these testing functions, we obtain, by exploiting the identity $\langle \vec{v}, \text{curl}_\Gamma \text{curl}_\Gamma \vec{e} \rangle = \langle \text{curl}_\Gamma \vec{v}, \text{curl}_\Gamma \vec{e} \rangle$ for close surfaces (i.e., for tetrahedral and triangular discrete domain elements):

$$\langle \gamma_t \vec{v}_1, \vec{j}_1 \rangle_{\Gamma_{12}} + \langle \gamma t \vec{v}_1, A_1 \vec{e}_1 \rangle_{\Gamma_{12}} + \langle \text{curl}_\Gamma (\gamma_t \vec{v}_1), B_1 \text{curl}_\Gamma \vec{e}_1 \rangle_{\Gamma_{12}} - \langle \gamma_t \vec{v}_1, \vec{j}_2 \rangle_{\Gamma_{12}} + \langle \gamma_t \vec{v}_1, A_1 \vec{e}_2 \rangle_{\Gamma_{12}} + \langle \text{curl}_\Gamma (\gamma_1 \vec{v}_1), B_1 \text{curl}_\Gamma \vec{e}_2 \rangle_{\Gamma_{12}} \quad (2).$$

From the above equations, and analogous equations for the electric fields $\vec{E}_2$ and surface electric currents $\vec{j}_2$ in subdomain $\Omega_2$, the system matrix equation may be obtained:

$$\begin{bmatrix} K_1 & -G_{12} \\ -G_{21} & K_2 \end{bmatrix} \begin{bmatrix} \bar{u}_1 \\ \bar{u}_2 \end{bmatrix} = \begin{bmatrix} \bar{y}_1 \\ \bar{y}_2 \end{bmatrix}.$$

Herein, the diagonal blocks $K_i$ are submatrices corresponding to subdomains $\Omega_i$, and the off-diagonal blocks $-G_{ij}$ are submatrices corresponding to coupling between subdomains $\Omega_i$ and $\Omega_j$. The vectors $\bar{u}_i$ and $\bar{y}_i$ specify the physical fields and excitations, respectively:

$$\bar{u}_i = \begin{pmatrix} \bar{E}_i \\ \bar{e}_i \\ \bar{j}_i \end{pmatrix} \text{ and } \bar{y}_i = \begin{pmatrix} \bar{b}_i \\ 0 \\ 0 \end{pmatrix}.$$

The submatrices $K_i$ and $G_{ij}$ are given by:

$$K_i = \begin{pmatrix} A_i & C_i & 0 \\ C_i^T & B_i + S_{ii} + T_{ii}^e & -T_{ii}^e \\ 0 & S_{ii} + T_{ii}^e & T_{ii}^j \end{pmatrix} \text{ and } G_{ij} = \begin{pmatrix} 0 & 0 & 0 \\ 0 & 0 & 0 \\ 0 & S_{ij} + T_{ij}^e & -T_{ij}^j \end{pmatrix},$$

wherein $S_{ij} = \langle \text{curl}_\Gamma(\gamma_t \vec{v}_i), B_i \text{curl}_\Gamma \vec{v}_j \rangle_{\Gamma_{ij}}$, $T_{ij}^j = \langle \gamma_t \vec{v}_i, \gamma_t \vec{v}_j \rangle_{\Gamma_{ij}}$, $T_{ij}^e = \langle \gamma_t \vec{v}_i, A_i \gamma_t \vec{v}_j \rangle_{\Gamma_{ij}}$. (Note that matrix components are to be computed not only for each combination of i and j, but also for each finite element of the field expansion.) The matrix sub-blocks $A_i$, $B_i$, and $C_i$ are traditional FEM matrices, well known to persons of skill in the art, which may be found, for example, in Lee, S. C. et al., "A Non-Overlapping Domain Decomposition Method with Non-Matching Grids for Modeling Large Finite Antenna Arrays," J. Comput. Phys., vol. 203, pp. 1-21 (February 2005), the entire disclosure of which is hereby incorporated herein by reference.

The blocks $K_i$ and $G_{ij}$ as defined above are non-symmetric. In problem formulations using first-order Robin transmission conditions, symmetric blocks can be accomplished via transformation, by splitting the surface integral of equation (1) into two halves, and replacing one half by an equivalent expression based on equation (2). This approach is, however, not generalizable to second-order Robin transmission conditions, i.e., it does not result in symmetric submatrix blocks. In various embodiments that utilize second-order Robin transmission conditions, therefore, another approach is used to simplify the system matrix: instead of splitting the surface integral of equation (1) (i.e., expression $\langle \gamma_t \vec{v}_1, \vec{j}_1 \rangle_{\Gamma_{12}}$), the entire surface integral is replaced by the corresponding terms in equation (2), i.e., by:

$$-\langle \gamma_1 \vec{v}_1, A_1 \vec{e}_1 \rangle_{\Gamma_{12}} - \langle \text{curl}_\Gamma(\gamma_1 \vec{v}_1), B_1 \text{curl}_\Gamma \vec{e}_1 \rangle_{\Gamma_{12}} - \langle \gamma_1 \vec{v}_1, \vec{j}_2 \rangle_{\Gamma_{12}} + \langle \gamma_1 \vec{v}_1, A_1 \vec{e}_2 \rangle_{\Gamma_{12}} + \langle \text{curl}_\Gamma(\gamma_1 \vec{v}_1), B_1 \text{curl}_\Gamma \vec{e}_2 \rangle_{\Gamma_{12}}.$$

As a result, the system matrix blocks take the following form:

$$K_i = \begin{pmatrix} A_i & C_i & 0 \\ C_i^T & B_i + S_{ii} + T_{ii}^e & 0 \\ 0 & S_{ii} + T_{ii}^e & T_{ii}^j \end{pmatrix} \text{ and } G_{ij} = \begin{pmatrix} 0 & 0 & 0 \\ 0 & S_{ij} + T_{ij}^e & -T_{ij}^j \\ 0 & S_{ij} + T_{ij}^e & -T_{ij}^j \end{pmatrix}.$$

While the subdomain matrices $K_i$ are still non-symmetric, they have block lower triangular form. Specifically, $K_i$ may be rewritten as:

$$K_i = \begin{bmatrix} K_{PP} & 0 \\ K_{DP} & K_{DD} \end{bmatrix},$$

where $$K_{PP} = \begin{bmatrix} A_i & C_i \\ C_i^T & B_i + S_{ii} + T_{ii}^e \end{bmatrix}, K_{DD} = T_{ii}^j, \text{ and } K_{DP} = \begin{bmatrix} 0 & S_{ii} + T_{ii}^e \end{bmatrix}.$$

The sub-block $K_{PP}$ is symmetric and very similar to the system matrix of a traditional FEM approach (differing only in that it accounts for additional Robin interfaces), and the sub-block $K_{DD}$ is a real positive definite matrix whose dimension is much smaller than $K_{PP}$, and, thus, does not impose significant computational overhead.

As explained above, the iterative solution of the system matrix equation requires iterative computations of correction vectors $\bar{r}_i^{(n)} = K_i^{-1} G_{ij} \bar{u}_j^{(n-1)}$ and, thus, inversion of the subdomain matrices. The inverse of subdomain matrix $K_i$ is:

$$K_i^{-1} = \begin{bmatrix} K_{PP}^{-1} & 0 \\ -K_{DD}^{-1} K_{DP} K_{PP}^{-1} & K_{DD}^{-1} \end{bmatrix},$$

and its application to a vector $\bar{v}$ results in:

$$K_i^{-1} \bar{v} = \begin{bmatrix} K_{PP}^{-1} & 0 \\ -K_{DD}^{-1} K_{DP} K_{PP}^{-1} & K_{DD}^{-1} \end{bmatrix} \begin{bmatrix} \bar{v}_{PP} \\ \bar{v}_{DD} \end{bmatrix} = \begin{bmatrix} K_{PP}^{-1} \bar{v}_{PP} \\ K_{DD}^{-1} (\bar{v}_{DD} - K_{DP} K_{PP}^{-1} \bar{v}_{PP}) \end{bmatrix}.$$

As can be seen, any inverse operation of $K_i$ can, advantageously, be obtained through inverse operations of $K_{PP}$ and $K_{DD}$, resulting in smaller memory requirements than would be necessary if $K_i$ did not have block lower triangular form. The sub-blocks may be factorized into lower and upper triangular matrices L and U (an operation known to persons of skill in the art as "LU factorization"). While non-symmetric full factorized matrices require both L and U to be stored, the full information of $K_{PP}$ and $K_{DD}$ is, due to their symmetry, contained in either L or U, resulting in memory savings of about a factor of two.

2. Matrix Preconditioning with Modified Gauss-Seidel Preconditioners

As noted above with reference to FIG. 1, the convergence properties of an iterative solution method can often be improved by applying a preconditioner to the system matrix (steps 110 and 112). In the context of domain decomposition, this involves splitting a system matrix A into two matrices A=M−N, such that the system matrix equation $A\bar{x}=\bar{b}$ becomes $M\bar{x}=\bar{b}+N\bar{x}$. Starting with an initial guess $\bar{x}^{(0)}$, which is often set to zero, this equation can be solved iteratively according to:

$$\bar{x}^{(n+1)} = M^{-1}\bar{b} + M^{-1}N\bar{x}^{(n)} = M^{-1}(\bar{b}+M\bar{x}^{(n)}-A\bar{x}^{(n)}) = \bar{x}^{(n)} + M^{-1}(\bar{b}-A\bar{x}^{(n)}).$$

Thus, one of the major computations performed by an iterative solver is $M^{-1}A\bar{x}$. Defining the error vector (also referred to as "residual vector") $\bar{r}(n) = \bar{b} - A\bar{x}^{(n)}$, the iterations may continue until a convergence criterion (or "termination condition")

$$\frac{\|\bar{r}^{(n)}\|}{\|\bar{b}\|} \leq \varepsilon,$$

where $\varepsilon$ is a user-defined error, is satisfied, indicating that $\bar{x}^{(n)}$ has converged to the correct solution. The matrix $M^{-1}$ is usually referred to as the preconditioner of the system matrix A, and its choice is critical to the convergence of the iterative process. For the iterative solver to converge, M and N are generally chosen such that the spectral radius of the preconditioner, $\rho(M^{-1}N)$, which is defined as the eigenvalue with the largest absolute value (i.e., distance from the origin), is smaller than one.

In domain decomposition methods, Jacobi and Gauss-Seidel preconditioners are frequently used. Consider, for example, the system matrix for a domain that is one-dimensionally partitioned into three subdomains in a manner such that interfaces exist between the first and second subdomains, and between the second and third subdomains, but not between the first and third subdomains:

$$K = \begin{bmatrix} K_1 & -G_{12} & 0 \\ -G_{21} & K_2 & -G_{23} \\ 0 & -G_{32} & K_3 \end{bmatrix}.$$

This matrix is sparse, i.e., it contains off-diagonal blocks that are zero, reflecting the fact that not every subdomain is coupled to every other subdomain (In the example, the first and third subdomains are uncoupled, such that $G_{13}=0$.)

The Jacobi preconditioner of a matrix is, generally, the inverse of its diagonal terms (the diagonal terms being, in DDMs, the diagonal blocks). For the exemplary matrix above, the Jacobi preconditioner is:

$$M_J^{-1} = \begin{bmatrix} K_1^{-1} & 0 & 0 \\ 0 & K_2^{-1} & 0 \\ 0 & 0 & K_3^{-1} \end{bmatrix},$$

and the resulting Jacobi-preconditioned matrix is:

$$M_J^{-1}K = \begin{bmatrix} I & -K_1^{-1}G_{12} & 0 \\ -K_2^{-1}G_{21} & I & -K_2^{-1}G_{23} \\ 0 & -K_3^{-1}G_{32} & I \end{bmatrix}.$$

Due to the block-diagonal form of the Jacobi preconditioner, the iterations are inherently parallelizable, i.e., computations for the various subdomains can be carried out in parallel, reducing computation time.

The Gauss-Seidel preconditioner of a matrix is, generally, the inverse of its lower triangular part, which is, for the above exemplary matrix:

$$M_{GS}^{-1} = \begin{bmatrix} K_1 & 0 & 0 \\ -G_{12} & K_2 & 0 \\ 0 & -G_{32} & K_3 \end{bmatrix}^{-1}.$$

Figure 3:
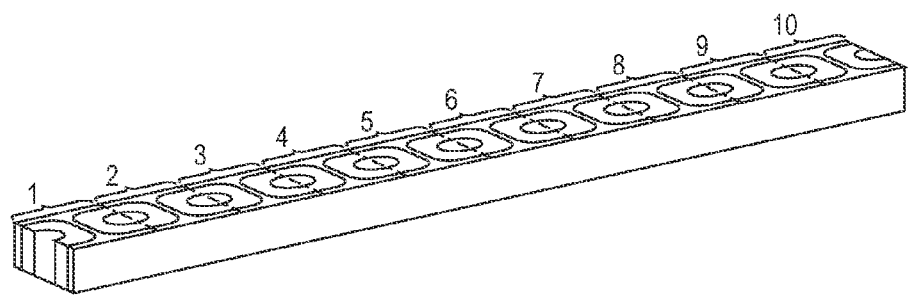
FIG. 3 is a schematic drawing of a rectangular waveguide domain divided into ten subdomains in accordance with one embodiment.

The convergence rate of Gauss-Seidel iterations is typically about twice that of Jacobi iterations. Moreover, using a Gauss-Seidel preconditioner, the convergence can be further improved by numbering the subdomains appropriately, e.g., in the order in which the wave front propagates. FIG. 3 illustrates, for example, a cuboid domain that is "sliced," i.e., linearly portioned, into ten adjacent subdomains. Assuming that a wave is excited on the left, the subdomains may be numbered from left to right. In general, the subdomains of any decomposition scheme are preferably numbered starting with the subdomain containing the excitation, followed by the adjacent subdomains (i.e., the "next neighbors" of the first subdomain), followed by the subdomains surrounding the neighbors (i.e., the "second neighbors" of the first subdomain), etc., until all subdomains are numbered. In contrast to Jacobi preconditioners, Gauss-Seidel preconditioners "respect" the subdomain ordering in the sense that their convergence rate generally depends on the ordering. In Jacobi iteration methods, the previous iteration's solution is used to update the current iteration's solution. However, for some subdomains, some neighboring subdomains may already have an updated solution, and Jacobi iterations fail to take advantage of this property. In Gauss-Seidel iteration methods, the most updated solution for each subdomain is used. Therefore, Gauss-Seidel methods are generally faster to converge, but domain-ordering dependent. For the same reason, Gauss-Seidel methods are sequential in nature.

In various embodiments of the present invention, the system matrix is preconditioned with a modified Gauss-Seidel preconditioner that combines the advantages of Gauss-Seidel and Jacobi preconditioners. The (exact) Gauss-Seidel-preconditioner can be factorized into the product of a Jacobi preconditioner of the system matrix, and a Gauss-Seidel preconditioner of the Jacobi-preconditioned matrix, resulting, after application to the system matrix, in:

$$M_{GS}^{-1}K = \begin{bmatrix} I & 0 & 0 \\ K_2^{-1}G_{21} & I & 0 \\ K_3^{-1}G_{32}K_2^{-1}G_{21} & K_3^{-1}G_{32} & I \end{bmatrix} \begin{bmatrix} I & -K_1^{-1}G_{12} & 0 \\ -K_2^{-1}G_{21} & I & -K_2^{-1}G_{23} \\ 0 & -K_3^{-1}G_{32} & I \end{bmatrix}.$$

The sequential nature of the Gauss-Seidel preconditioner results from the higher-order term $K_3^{-1}G_{32}K_2^{-1}G_{21}$. Therefore, by dropping this term, parallelizability can be maintained without significantly affecting convergence. Accordingly, various embodiments utilize a modified Gauss-Seidel preconditioner comprising two preconditioning steps:

$$\tilde{M}_{GS}^{-1}K = \begin{bmatrix} I & 0 & 0 \\ K_2^{-1}G_{21} & I & 0 \\ 0 & K_3^{-1}G_{32} & I \end{bmatrix} \begin{bmatrix} I & -K_1^{-1}G_{12} & 0 \\ -K_2^{-1}G_{21} & I & -K_2^{-1}G_{23} \\ 0 & -K_3^{-1}G_{32} & I \end{bmatrix}.$$

The modified Gauss-Seidel preconditioner can be readily generalized to an arbitrary number of subdomains. In the case of only two subdomains, the modified Gauss-Seidel preconditioner reduces identically to the Gauss-Seidel preconditioner. For four subdomains in a one-dimensional arrangement, the modified Gauss-Seidel preconditioner yields:

$$\tilde{M}_{GS}^{-1}K = \begin{bmatrix} I & 0 & 0 & 0 \\ K_2^{-1}G_{21} & I & 0 & 0 \\ 0 & K_3^{-1}G_{32} & I & 0 \\ 0 & 0 & K_4^{-1}G_{43} & I \end{bmatrix}$$

$$\begin{bmatrix} I & -K_1^{-1}G_{12} & 0 & 0 \\ -K_2^{-1}G_{21} & I & -K_2^{-1}G_{23} & 0 \\ 0 & -K_3^{-1}G_{32} & I & -K_3^{-1}G_{34} \\ 0 & 0 & -K_4^{-1}G_{43} & I \end{bmatrix}.$$

For N subdomains, modified Gauss-Seidel preconditioning results in:

$$\tilde{M}_{GS}^{-1}K = \begin{bmatrix} I & 0 & 0 & 0 & 0 \\ -K_2^{-1}G_{21} & I & 0 & 0 & 0 \\ 0 & \ddots & I & 0 & 0 \\ 0 & 0 & -K_{n-1}^{-1}G_{n-1,n-2} & I & 0 \\ 0 & 0 & 0 & -K_n^{-1}G_{n,n-1} & I \end{bmatrix}.$$

$$\begin{bmatrix} I & -K_1^{-1}G_{12} & 0 & 0 & 0 \\ -K_2^{-1}G_{21} & I & -K_2^{-1}G_{23} & 0 & 0 \\ 0 & \ddots & I & \ddots & 0 \\ 0 & 0 & -K_{n-1}^{-1}G_{n-1,n-2} & I & -K_{n-1}^{-1}G_{n-1,n} \\ 0 & 0 & 0 & -K_n^{-1}G_{n,n-1} & I \end{bmatrix}$$

Further, while the examples set forth above illustrate only the case of one-dimensional partitioning of the domain, a modified Gauss-Seidel preconditioner may also be applied in conjunction with two- or higher-dimensional domain decomposition schemes, where a larger number of off-diagonal blocks are non-zero. In most such cases, the system matrix (and the resulting preconditioner) is still sparse because most of the subdomains interface with only a few of the other subdomains. Moreover, the blocks (i.e., the submatrices) themselves are typically sparse.

The modified Gauss-Seidel preconditioner may be applied to system matrices for electromagnetic simulations, e.g., the matrix formulation using second-order Robin transmission conditions described in section 1 above. However, the use of modified Gauss-Seidel preconditioners in accordance with various embodiments is in no way limited to that problem formulation, nor to electromagnetic simulations. Rather, a modified Gauss-Seidel preconditioner may, generally, be applied to any system matrix, whether it represents vector or scalar quantities. It may be particularly beneficial to formulations based on domain decomposition, which typically result in a spectral radius of the preconditioned matrix of less than one.

3. Simultaneous Solution for Multiple Excitations

In various embodiments, the system matrix equation (which may model any physical system, such as, e.g., an electromagnetic field) is solved using a type of Krylov subspace iterative solver. In general, Krylov solvers are advantageous in that they do not require preconditioning the matrix such that the spectral radius $\rho(M^{-1}N)$ corresponding to the preconditioner is less than one. Nonetheless, the convergence properties of a Krylov method may benefit from applying, for example, a modified Gauss-Seidel preconditioner in each step of the iterative solution process.

In certain Krylov iterative methods, the solution vector $\bar{x}$ is expressed in a subspace spanned by the Krylov vectors $\{\bar{p}^{(1)}, \bar{p}^{(2)}, \ldots, \bar{p}^{(n)}\}$:

$$\bar{x}^{(n)} = \sum_{i=1}^{n} c_i \bar{p}^{(i)},$$

where n is the number of the iteration. With each iteration, the dimensionality of the Krylov subspace increases by one, allowing a residual vector (also referred to as error vector) associated with the approximation to be reduced by its component along the newly added dimension of the subspace. In other words, the residual vector is successively projected into the space orthogonal to the Krylov subspace, which is diminished as new Krylov vectors are added. The coefficients $c_i$ can, in principle, be derived from the condition:

$$A \sum_{i=1}^{n} c_i \bar{p}^{(i)} = \bar{b},$$

which implies:

$$P^T A P \bar{c} = P^T \bar{b},$$

where $$P = [\bar{p}^{(1)} \quad \bar{p}^{(2)} \quad \ldots \quad \bar{p}^{(n)}]$$

is a dense matrix, and $$\bar{c} = [c_1 \quad c_2 \quad \ldots \quad c_n]^T$$

is a column vector. If the Krylov vectors are "A-conjugate," i.e., chosen such that $$\bar{p}^{(i)T} A \bar{p}^{(j)} = \delta_{ij},$$

the coefficients are given by $\bar{c} = P^T \bar{b}$. An A-conjugate Krylov subspace may be built from the residual vectors $\bar{r}^{(i)}$ in each iteration using a modified Gram-Schmidt process, as is known to those of skill in the art.

In certain simulation problems, the solution of the matrix equation—i.e., the behavior of the physical system that is simulated—is sought for multiple excitations $\bar{b}_i$ (i=1, 2, ... m):

$$A^{N \times N} X^{N \times m} = B^{N \times m},$$

where m is the number of excitations, N is the number of unknowns, $$B = [\bar{b}_1 \ \bar{b}_2 \ ... \ \bar{b}_m]$$

is a matrix formed by the excitations, and $$X = [\bar{x}_1 \ \bar{x}_2 \ ... \ \bar{x}_m]$$

is the matrix of corresponding solution vectors. While this matrix equation can be solved by forming a Krylov subspace in which the corresponding solution vector is expressed for each excitation independently, it may be advantageous to take advantage of any overlap in the Krylov subspaces by creating a joint Krylov subspace for all excitations. Accordingly, in certain embodiments, the matrix equations for the excitations are solved simultaneously by using the Krylov vector generated in each iteration to update all of the solution vectors. Denoting the residual vectors as $R=[\bar{r}_1 \bar{r}_2 ... \bar{r}_m]$, with $\bar{r}_i=\bar{b}_i-A\bar{x}_i$, a residual error $\epsilon_i$ may be defined for each excitation i as the ratio between the norm of the residual vector and the norm of the excitation vector:

$$\varepsilon_i = \frac{\|\bar{r}_i\|_2}{\|\bar{b}_i\|_2}.$$

The method is adapted to correct, in each iteration, the solution vector corresponding to the largest residual error.

Figure 4:
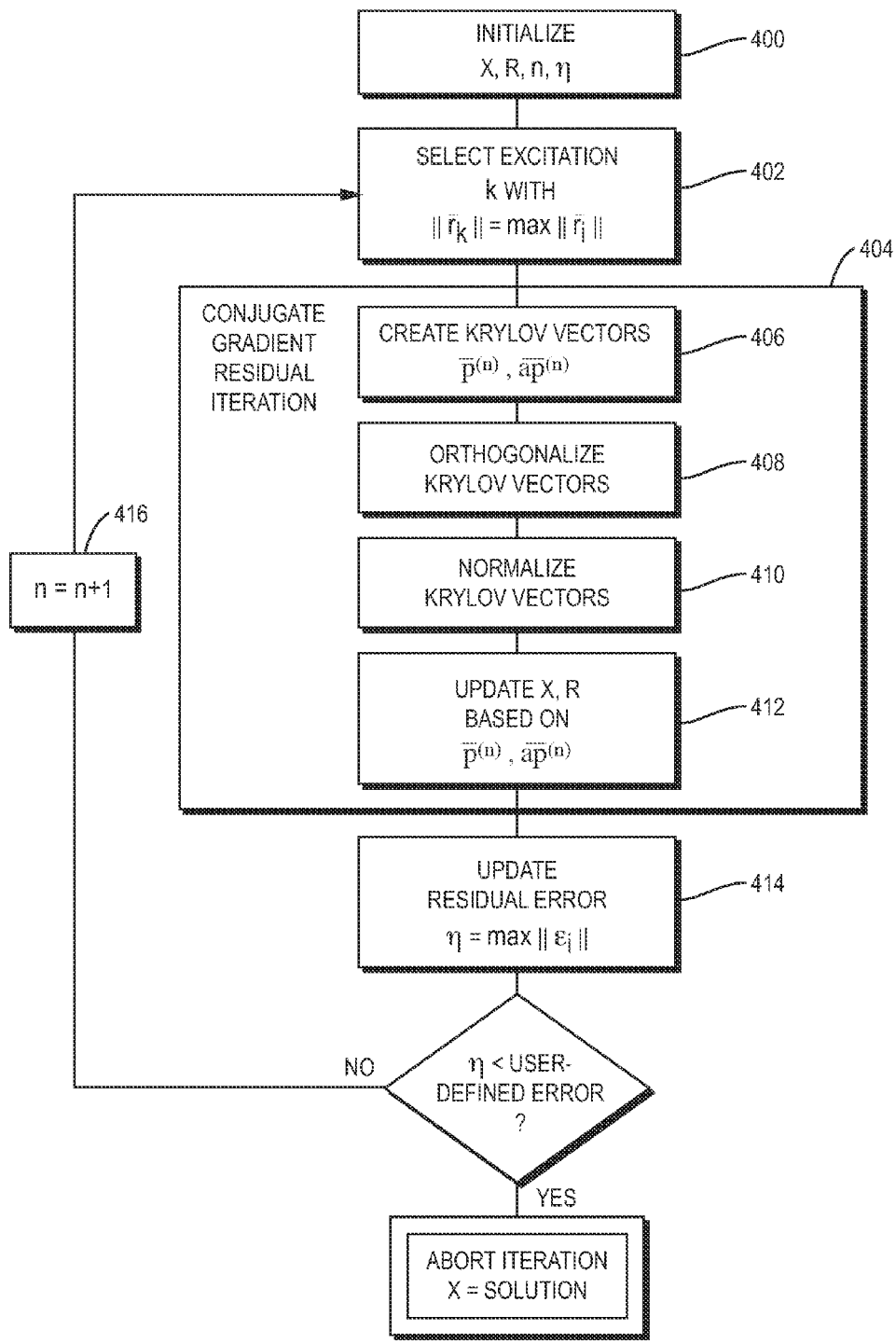
FIG. 4 is a flow chart illustrating a method for solving a matrix equation simultaneously for multiple excitations in accordance with various embodiments.

FIG. 4 illustrates the steps of an exemplary method for simulating a physical system (such as a physical field or network) simultaneously for multiple excitations. In a first step 400, the solution vectors are initialized (e.g., by setting X=0), the corresponding residual vectors are determined (resulting, for X=0, in R=B), and the iteration counter n is set equal to 1. (Optionally, the maximum residual error η may be initialized, e.g., set to 1.0.) In step 402, the excitation index k that corresponds to the largest residual vector $\|\bar{r}_k\|=\max_i\|\bar{r}_i\|_2$ (i=1, 2, ... m) is identified. Then, a conjugate gradient residual (CGR) iteration is performed based on the selected excitation (step 404).

The CGR iteration involves, first (in step 406), generating a new Krylov vector $\bar{p}^{(n)}$ and an associated second Krylov vector $\overline{ap}^{(n)}$ according to:

$$\bar{p}^{(n)} = \frac{\bar{r}_k}{\|\bar{r}_k\|_2} \text{ and } \overline{ap}^{(n)} = A\bar{r}_k.$$

The Krylov subspaces $$P = [\bar{p}^{(1)} \ \bar{p}^{(2)} \ ... \ \bar{p}^{(n)}]$$

and $$AP = [A\bar{p}^{(1)} \ A\bar{p}^{(2)} \ ... \ A\bar{p}^{(n)}]$$

are accumulated during the iterative procedure, i.e., Krylov vectors created during previous iterations are "recycled" into subsequent iterations. To ensure linear independence of the vectors in each Krylov subspace, a modified Gram-Schmidt procedure is applied to newly generated Krylov vectors (step 408), i.e., the new Krylov vectors $\bar{p}^{(n)}$ and $\overline{ap}^{(n)}$ are orthogonalized with respect to all of the previously accumulated Krylov vector $\bar{p}^{(i)}$ and $\overline{ap}^{(i)}$ for i=1 ... n-1:

$$\alpha = \overline{ap}^{(i)H} \overline{ap}^{(n)}, \bar{p}^{(n)} = \bar{p}^{(n)} - \alpha \overline{ap}^{(i)}, \text{ and } \overline{ap}^{(n)} = \overline{ap}^{(n)} - \alpha \overline{ap}^{(i)},$$

Where the superscript "H" denotes the conjugate transpose. Then, in step 410, the new Krylov vectors are normalized, e.g., by setting:

$$\bar{p}^{(n)} = \frac{\bar{p}^{(n)}}{\|\overline{ap}^{(n)}\|} \text{ and } \overline{ap}^{(n)} = \frac{\overline{ap}^{(n)}}{\|\overline{ap}^{(n)}\|}.$$

Finally, in step 412, the solution vectors $\bar{x}_i$ and associated residual vectors $\bar{r}_i$ are updated for all excitations (i.e., for i=1 ... m) based on the new Krylov vectors:

$$\beta = \overline{ap}^{(n)H} \bar{r}_i, \bar{x}_i = \bar{x}_i + \beta \bar{p}^{(n)}, \text{ and } \bar{r}_i = \bar{r}_i - \beta \overline{ap}_n.$$

Following the CGR iteration, in step 414, the maximum residual error is updated: $\eta = \max_i(\epsilon_i)$. If the maximum residual error is less than a user-defined error threshold, the iterative procedure is aborted; otherwise, the iteration counter is n incremented (i.e., n=n+1) (step 416), and steps 402-414 are repeated for a new excitation index k corresponding to the then largest residual vector. When the maximum residual error η falls below the user-defined threshold, the iterative process is terminated, and the approximated solution vectors are considered the desired solution. In some (but not all) cases, the approximated solution vectors converge to the exact solution.

The adaptive Krylov iterative recycling technique illustrated in FIG. 4 has a number of advantageous properties. It solves the matrix equation for all right-hand sides (i.e., excitations) simultaneously, processing in each iteration the most "difficult" right-hand side, i.e., the one corresponding to the largest residual error. The successively built-up Krylov spaces are reused and shared among all right-hand sides. By applying only one CGR iteration at a time for a selected right-hand side, the overall time for obtaining solution for all right-hand sides is reduced (compared with methods in which a Krylov technique solves the equations for multiple excitations independently). Further, Krylov vectors spanning the Krylov subspaces are, due the orthogonalization step, linearly independent, which avoids break-down of the iterative procedure.

The above-described method for simultaneously solving the matrix equation for multiple excitations is particularly effective if the right-hand sides are linearly dependent, as is the case, for example, in monostatic radar cross section (RCS) applications. However, the method is generally applicable to any matrix equation with multiple right-hand sides. In some applications, the accumulation of the Krylov subspaces imposes large memory requirements. The size of the Krylov subspaces, and the resulting memory requirements, may, however, be reduced in certain embodiments by using domain-decomposition formulations with second-order Robin transmission conditions and/or applying a modified Gauss-Seidel preconditioner to the system matrix.

4. Computer System for Simulating Physical Fields and Networks

Figure 5:
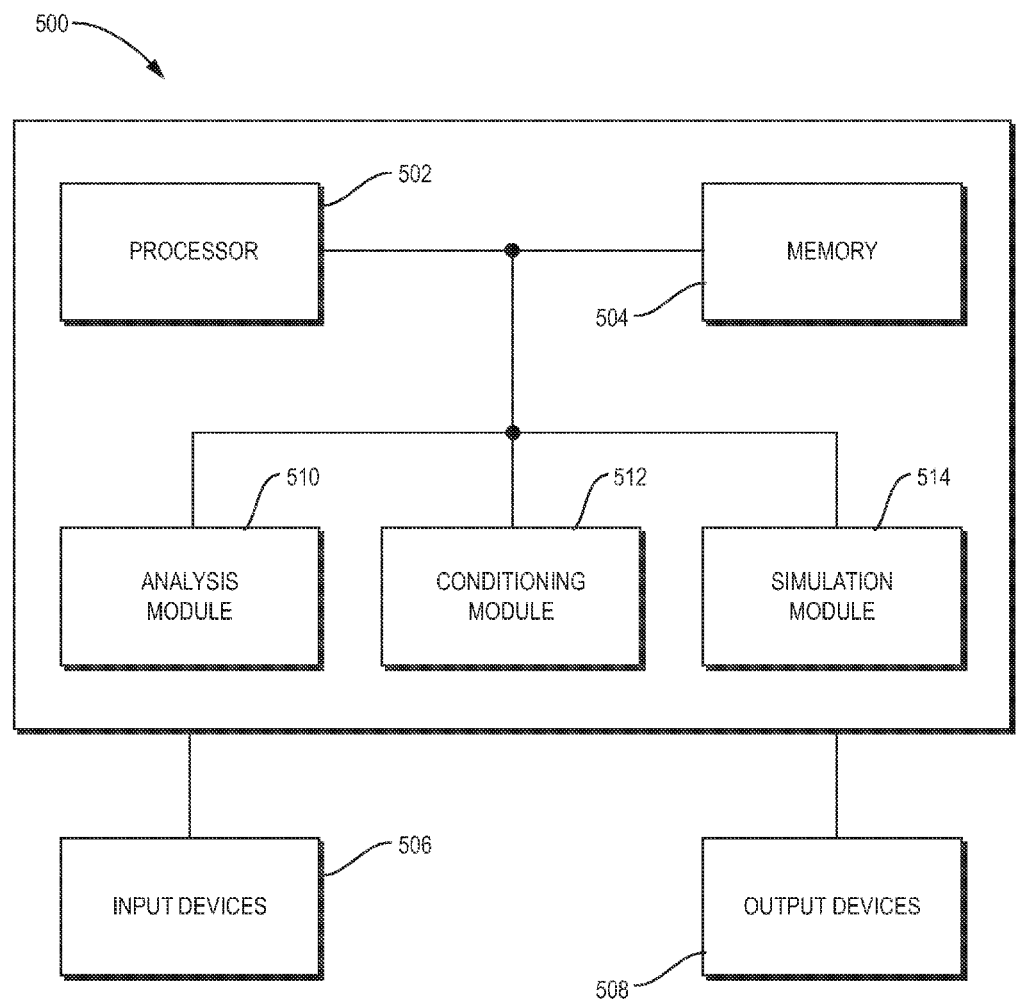
FIG. 5 is a block diagram of a system implementing simulation methods in accordance with various embodiments.

The above-described methods for simulating physical systems (such as, e.g., electromagnetic fields) may be implemented in a computer system (e.g., on a general-purpose computer furnished with suitable software) or, more generally, with hardware, software, or a combination of both. An exemplary system 500 is illustrated in FIG. 5 in block-diagram form. The system 500 includes a processing unit 502 (e.g., a conventional microprocessor) in communication with a main system memory 504 (typically a volatile random-access memory). A partition of the memory 504 stores parameters representative of the physical system to be simulated (e.g., parameters representative of a user-defined domain and a physical field simulated therein). In various embodiments, a user may provide certain such parameters via one or more input devices 506. For example, the user may specify the boundaries and material properties of the user-defined domain, and/or select the types of fields (e.g., electrical, magnetic, temperature, pressure, etc.) to be simulated. The system 500 may also include output devices 508, such as screen displays or printers. An screen display may, for example, render a graphical representation of a physical object, a user-defined domain of the object, and a physical field simulated within the domain. Properties of the field, such as field amplitude and/or phases may, for example, be represented in a color-coded map.

The system 500 further includes executable instructions, some of which are conceptually illustrated as a group of modules, that control the operation of the processing unit 502 and its interaction with the other hardware components. Some of these modules carry out the modeling and simulation techniques described above. In particular, an analysis module 510 models the physical system to be simulated, e.g., by generating a system of equations (or a matrix equation) that describe the behavior of the system. The modeling may be based on user-provided parameters of the system stored in the memory partition. In some embodiments involving simulations of physical fields in a user-defined domain, the analysis module partitions the domain into multiple subdomains, and models the fields within the subdomain with a block system matrix. For electromagnetic fields, the system matrix may be created using second-order (or higher-order) Robin transmission conditions selected as described earlier. The system may further include a conditioning module 512 that preconditions the matrix for subsequent iterative solution. The conditioning module may apply a pre-determined preconditioner, or facilitate user selection from among several preconditioners (including, e.g., Jacobi preconditioners, Gauss-Seidel preconditioners, and modified Gauss-Seidel preconditioners). A simulation module (or iterative solver) 514, finally, facilitates iterative solution of the system matrix equation. The simulation module 514 may be adapted to solve a matrix equation for multiple right-hand sides simultaneously, using, e.g., an adapted Krylov iterative recycling algorithm as detailed earlier. A graphics module (not shown) in communication with the analysis, conditioning, and/or simulation modules may serve to render a physical object, system, or field subject to simulation on a display or other output device 508.

As noted, the modules 510, 512, 514 may be realized as software instructions which are, in operation, stored in memory 504. The software may be written in any one of a number of high level languages such as C, C++, C#, CUDA, OpenCL, FORTRAN, PASCAL, JAVA, LISP, PERL, BASIC or any suitable programming language. Alternatively, the software may be implemented in an assembly language and/or machine language directed to a microprocessor or specialized high-performance computational hardware, such as a GPU, resident on a target device. In still other implementations, various of the operations attributed to one or more of the modules 510, 512, 514 are carried out by dedicated hardware circuitry (e.g., a field-programmable gate array (FPGA) or application-specific integrated circuit (ASIC)).

5. Exemplary Applications

Figure 6A:
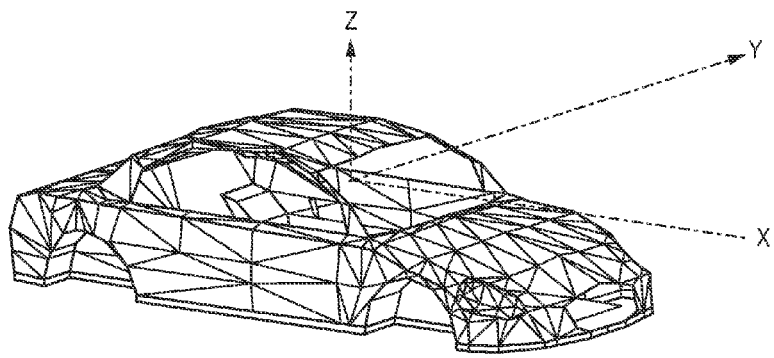
FIG. 6A is a user-defined domain representing a car body in accordance with one embodiment.
Figure 6B:
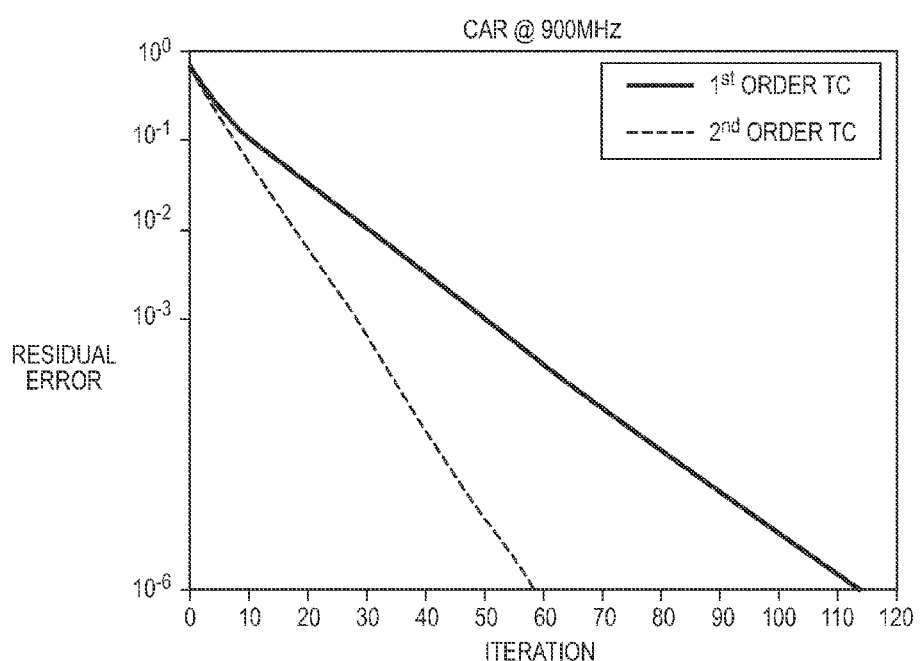
FIG. 6B is a graph illustrating the convergence of simulations of electromagnetic fields in the user-defined domain of FIG. 6A for second-order Robin transmission conditions in accordance with one embodiment, compared with second-order Robin transmission conditions.

Simulation methods in accordance with various embodiments may be used to simulate physical fields (or physical networks) for a number of practical applications. In certain embodiments, they provide performance enhancements such as, e.g., convergence rates that are increased by a factor of about two or more when compared with conventional simulation methods. FIGS. 6A and 6B illustrate an exemplary application of methods for simulating an electromagnetic field in a user-defined domain. FIG. 6A shows the user-defined domain—the body of a car—discretized into triangular elements. The domain is divided into four subdomains. A cell phone inside the car generates an electromagnetic field at a frequency of 900 MHz. FIG. 6B illustrates the convergence rate of the problem by plotting the residual error (i.e., the ratio of the magnitude of the residual vector and the excitation vector) as a function of the number of iterations. The dashed line represents the convergence resulting from a problem formulation that uses, in accordance with one embodiment, second-order Robin transmission conditions. For comparison, the solid line illustrates the convergence of a convention problem formulation with first-order Robin transmission conditions. As can be seen, second-order transmission conditions increase the convergence rate by about a factor of two.

Figure 7A:
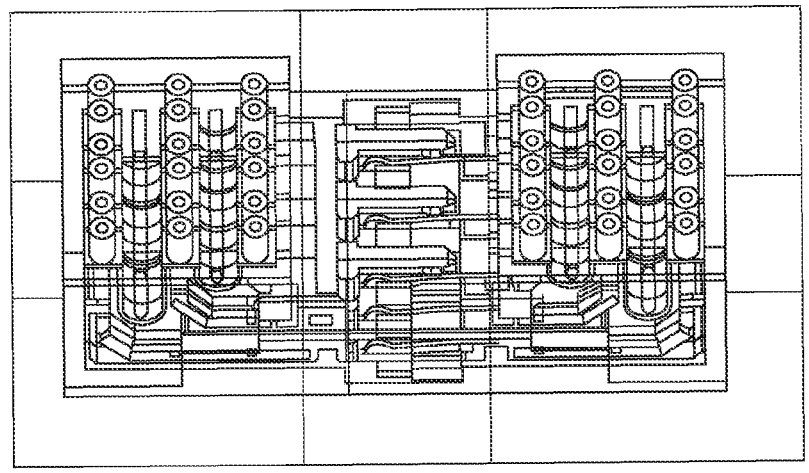
FIG. 7A is a user-defined domain representing an electronic circuit connector structure in accordance with one embodiment.
Figure 7B:
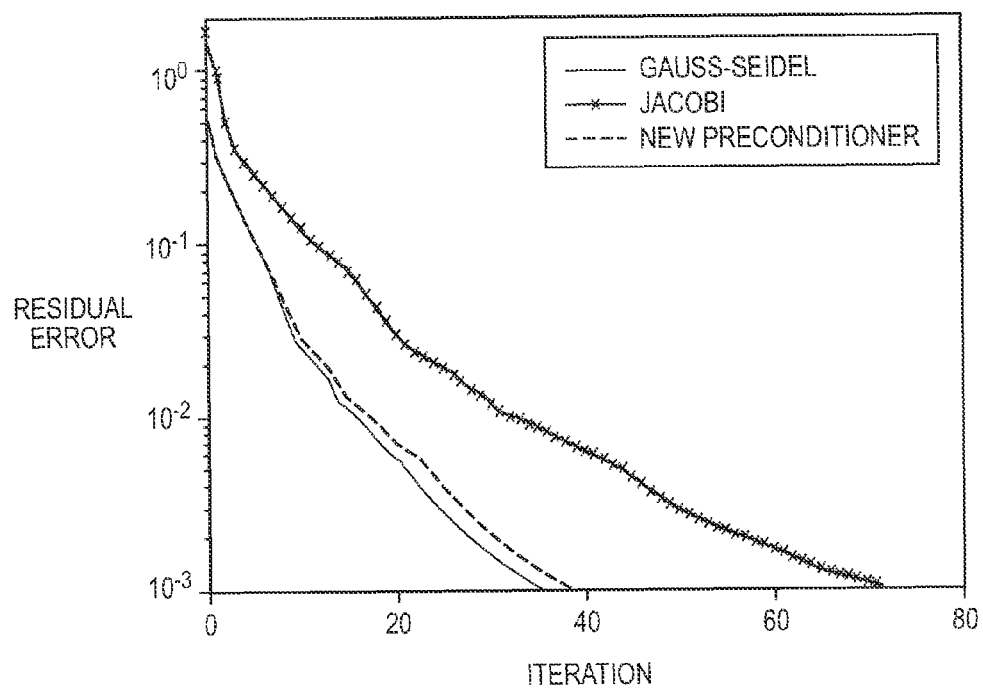
FIG. 7B is a graph illustrating the convergence of simulations of electromagnetic fields in the user-defined domain of FIG. 7A for modified Gauss-Seidel preconditioning in accordance with one embodiment, compared with conventional Jacobi and Gauss-Seidel preconditioning.

FIGS. 7A and 7B illustrate electromagnetic simulations of an electronic circuit connector structure. The structure itself, which constitutes the user-defined domain is shown in FIG. 7A. For the purpose of simulation, the domain is portioned into eight subdomains. FIG. 7B compares the convergence rate of the simulation for various preconditioners. Jacobi-preconditioning results in the slowest convergence; Gauss-Seidel preconditioning is about 1.8 times faster. As illustrated by the dashed line, a modified Gauss-Seidel preconditioner in accordance with one embodiment (which retains the parallelizability achieved with a Jacobi preconditioner) results in a convergence rate close to that obtained by conventional Gauss-Seidel preconditioning.

Although the present invention has been described with reference to specific details, it is not intended that such details should be regarded as limitations upon the scope of the invention, except as and to the extent that they are included in the accompanying claims.

What is claimed is:

1. A computer-implemented method of electronically simulating a physical system simultaneously for a plurality of excitations, the method comprising:
 (a) storing, in computer memory, a model of the physical system based on a system matrix; and
 (b) computationally simulating, using the computer, the physical system by:
   (1) initiating approximations of physical quantities associated with the physical system for the plurality of excitations; and
   (2) iteratively improving the approximations based, at least in part, on the model by:
    (i) computing a plurality of residual errors, each residual error being based on a residual vector corresponding to a different one of the plurality of excitations;

(ii) selecting an excitation from the plurality of excitations corresponding to a maximum one of the plurality of residual errors;

(iii) performing a single conjugate gradient residual (CGR) iteration based on the excitation corresponding to the maximum residual error;

(iv) updating the approximations for all of the excitations based, at least in part, on the selected excitation; and (v) repeating substeps (i) through (iv) until a termination condition is satisfied.

2. The method of claim 1, wherein the physical system comprises a physical field in a user-defined domain.

3. The method of claim 2, wherein the physical quantities comprise components of the physical field at a plurality of locations within the user-defined domain.

4. The method of claim 2, wherein the physical field comprises an electromagnetic field.

5. The method of claim 1, wherein the physical system comprises a physical network.

6. The method of claim 5, wherein the physical quantities are associated with components of the physical network.

7. The method of claim 5, wherein the physical network comprises at least one of an electronic circuit, an electrical circuit, a pneumatic circuit, and a hydraulic circuit.

8. The method of claim 1, wherein updating the approximations for all of the excitations comprises computing a Krylov vector for each iteration based, at least in part, on the selected excitation, and updating the approximations and the residual errors associated therewith for all of the plurality of excitations based, at least in part, on the Krylov vector for the respective iteration.

9. The method of claim 8, wherein updating the approximations for all of the excitations further comprises enforcing that the Krylov vectors are linearly independent.

10. The method of claim 9, wherein enforcing the linear independence of the Krylov vectors comprises conjugating the Krylov vectors by modified Gram-Schmidt conjugation.

11. The method of claim 1, wherein initiating the approximations of the physical quantities comprises setting the physical quantities to zero.

12. The method of claim 1, wherein each residual vector comprises a difference between the corresponding excitation and the corresponding approximation multiplied by the system matrix.

13. The method of claim 1, wherein simulating the physical system further comprises aborting the iterative improvements when the residual errors fall below a user-defined threshold.

14. The method of claim 12, wherein each residual error comprises a ratio of a norm of the corresponding residual vector and a norm of a corresponding excitation vector.

15. A computer system for simulating a physical system simultaneously for a plurality of excitations, the computer system comprising:

(a) a memory for storing parameters representative of the physical system; and (b) an analysis module for modeling the physical system with a system matrix;

(c) a simulation module for simulating the physical system by (1) initiating approximations of physical quantities associated with the physical system for the plurality of excitations; and (2) iteratively improving the approximations based, at least in part, on the model by (i) computing a plurality of residual errors, each residual error being based on a residual vector corresponding to a different one of the plurality of excitations;

(ii) selecting an excitation from the plurality of excitations corresponding to a maximum one of the plurality of residual errors;

(iii) performing a single conjugate gradient residual (CGR) iteration based on the excitation corresponding to the maximum residual error;

(iv) updating the approximations for all of the excitations based, at least in part, on the selected excitation; and (v) repeating substeps (i) through (iv) until a termination condition is satisfied.

16. The computer system of claim 15, wherein the physical system comprises a physical field in a user-defined domain.

17. The computer system of claim 15, wherein the analysis module updates the approximations for all of the excitations by computing a Krylov vector for each iteration based, at least in part, on the selected excitation, and updating the approximations and the residual errors associated therewith for all of the plurality of excitations based, at least in part, on the Krylov vector for the respective iteration.

\* \* \* \* \*